United States Patent [19]

Boll

[11] 4,030,083
[45] June 14, 1977

[54] SELF-REFRESHED CAPACITOR MEMORY CELL

[75] Inventor: Harry Joseph Boll, Berkeley Heights, N.J.

[73] Assignee: Bell Telephone Laboratories, Incorporated, Murray Hill, N.J.

[22] Filed: Dec. 18, 1975

[21] Appl. No.: 642,191

Related U.S. Application Data

[63] Continuation-in-part of Ser. No. 565,227, April 4, 1975, abandoned.

[52] U.S. Cl. .................... 340/173 DR; 340/173 CA
[51] Int. Cl.² ........................................ G11C 11/00
[58] Field of Search ............. 340/173 CA, 173 DR

[56] References Cited

UNITED STATES PATENTS

| | | | |
|---|---|---|---|
| 3,582,909 | 1/1971 | Booker | 340/173 R |
| 3,699,544 | 10/1972 | Joynson | 340/173 R |
| 3,753,248 | 8/1973 | Lynes | 340/173 R |
| 3,795,898 | 3/1974 | Metha | 340/173 R |
| 3,851,316 | 11/1974 | Kodama | 340/173 R |
| 3,858,184 | 12/1974 | DeVries | 340/173 R |
| 3,858,185 | 12/1974 | Reed | 340/173 R |
| 3,876,993 | 4/1975 | Gavanaugh | 340/173 R |
| 3,878,404 | 4/1975 | Walther | 340/173 R |
| 3,955,181 | 5/1976 | Raymond | 340/173 R |
| 3,968,480 | 7/1976 | Stein | 340/173 R |

OTHER PUBLICATIONS

H. K. Burke et al., 1972, IEEE International Solid State Circuits Conference, pp. 16–17, 2-16-1972.
R. E. Joynson et al., IEEE International Solid–State Circuits Conference, vol. SC-7, No. 3, pp. 217–224, June 1972.
T. R. Walther et al., 1972, IEEE International Solid State Circuits Conference, pp. 14–15, Feb. 16, 1972.
M. Eble et al., 1957, IEEE International Solid–State Circuits Conference, pp. 104–105, Feb. 13, 1975.

*Primary Examiner*—Terrell W. Fears
*Attorney, Agent, or Firm*—D. Caplan

[57] ABSTRACT

This invention involves a memory cell of, for example, the metal-oxide-semiconductor (MOS) capacitor type, which is accessed for reading and writing by means of an access network connected to the memory cell through a gating transistor, and which is provided with an independent refresh network for maintaining the memory state of the cell in the absence of an access writing signal. The refresh network includes a pair of IGFET (Insulated Gate Field-Effect Transistors) transistors connected between the MOS capacitor and an AC refresh line which is completely independent of the electrical access network. Either a "full" or "empty" capacitor memory state, binary digital 1 or 0, respectively, is maintained without the need for interrupting the reading and writing of the MOS capacitor through the gating transistor.

43 Claims, 6 Drawing Figures

FIG. 1.1

SELF-REFRESHED CAPACITOR MEMORY CELL

CROSS REFERENCE TO OTHER APPLICATIONS

This application is a continuation-in-part of my co-pending application Ser. No. 565,227, filed on Apr. 4, 1975.

FIELD OF THE INVENTION

This invention relates to the field of electrical memory apparatus, and more particularly to memory cells utilizing a capacitor as the memory storage element.

BACKGROUND OF THE INVENTION

Metal-insulator-semiconductor (MIS), and more specifically metal-oxide-semiconductor (MOS), capacitor memory cells are a form of dynamic memory cells. In an MIS capacitor dynamic memory cell, the information is stored in the form of the presence-vs-absence of charge in a capacitor, thereby representing a binary digital state of information. By "dynamic" is meant that the state of information in either one or the other (or both) of the two possible states tends to become degraded and ultimately to disappear with the passage of time.

An MOS capacitor memory cell can take the form of, for example, an N-type semiconductor covered with a silicon-dioxide insulator layer upon which a metal or metal-like electrical conducting plate is located. This conducting plate of the MOS capacitor is maintained at a fixed negative reference voltage while electrical writing and reading pulses are applied to the semiconductor surface portion of the capacitor (underlying the plate). A positive-going voltage or current write-in pulse, applied to the semiconductor surface portion of the MOS capacitor, injects positive charges ("hole" minority carriers) into this semiconductor substrate surface portion, thereby bringing the MOS capacitor into its binary digital 1 memory state ("full" of positive charge). On the other hand, a negative-going voltage or current write-in pulse to the semiconductor surface portion removes these positive charges out of the semiconductor substrate surface portion, thereby sharply reducing the positive charge in the semiconductor surface portion and bringing the MOS capacitor into its binary digital 0 memory state ("empty" of positive charge). However, this binary 0 state tends to become degraded with the passage of time subsequent to the negative-going write-in pulse, due to the thermal regeneration of spurious minority carriers (positively charged holes) in the N-type semiconductor substrate. This degradation takes place within the order of the semiconductor's thermal regeneration time during operation, typically of the order of a few milliseconds or less. However, even in the face of this memory degradation, a negative-going write-in voltage pulse can empty the MOS substrate surface portion of positive charges and thereby produce the binary 0 state of information for storage in the MOS capacitor at least for a short period of time; whereas, the presence of positive charges in the substrate surface portion due to a positive-going write-in pulse can produce the binary 1 for storage in the MOS capacitor.

In much of the prior art, in order to preserve the binary 0 state, the access network for reading and writing was required to devote a substantial portion of its operating time to the reading of the binary state of the capacitor only for the purpose of refreshing by re-writing the same state of the capacitor, that is, to read out and re-write even when it was not desired to read out the binary memory state of the capacitor for useful external access readout of the information stored in the MOS capacitor. This resulted in a significant loss of available access time for reading and writing, which can be an important disadvantage because system diagnostic testing consumes a substantial portion of total operating time and thus reduces this available access time, thereby putting a premium on the remaining available access time. By reason of this need for continual refreshing of the memory, not only was the memory thus not always available for external-use reading and writing, but the memory also required a substantial amount of standby power to be expended in the refresh cycles. This large expenditure of standby power arises from the fact that the entire amount of charge in the capacitor being refreshed must be removed, processed and returned during every refresh cycle. In large scale memory arrays, this standby power can thereby represent the greater portion of the total power associated with operation of the array. Moreover, in order to minimize the amount of time used for refreshing the MOS capacitor and hence increase the time available for external access reading and writing, it was necessary that the temperature of operation be kept rather low in order to decrease the required frequency of refresh by increasing the thermal regeneration time of charge carriers in the MOS capacitor, since it was the thermal regeneration of charge carriers which was responsible for the degradation and disappearance of the binary 0 state. Thus, the heatsinking problems are rather serious especially in large scale arrays.

The detection networks for many of the prior art MOS capacitor memory cell must be able to distinguish between a fully charged cell and a cell which has been partially filled by thermally generated carriers, thereby imposing rather severe requirements on the detection margins between the two states of binary 0 and 1. Finally, many of the prior art memory cells suffer from relatively low fabrication yield for mass memory arrays, due to localized high direct-current generation sources in the silicon substrate which can render any neighboring cells inoperative after the relatively long times between successive refreshes, in turn due to the relatively low refresh frequencies used in much of the prior art, of the order of a kilocycle. Increasing the frequencies of refreshing in this prior art would, however, concomitantly increase the required power and decrease the useful operating memory time available for external access reading and writing.

In a paper entitled "A Three Transistor MOS Memory Cell with Internal Refresh," published in the 1972 IEEE International Soild-State Circuits Conference, pp. 14–15, an integrated array of dynamic memory cells is described with a mass refresh, that is, a refresh of all cells occurs by means of read and write pulses to every cell. However, this necessitates the use of a rather complex memory cell. Moreover, these read and write pulses for refresh must be turned on and applied to the cells during time intervals during which these cells are again not available for external read or write access.

In U.S. Pat. No. 3,858,184, a peripheral circuit technique for a purported automatic noninterrupting dynamic memory refresh is set forth which, however, renders the memory cells unavailable for external read or write access during the refresh pulse intervals. While this patent describes a technique for "aborting" the refresh at command of the external access; nevertheless, the time required for such "aborting" will necessarily undesirably increase the access times themselves.

In U.S. Pat. No. 3,795,898, a cross-coupled transistor static memory cell configuration is disclosed with an alternating-current (A.C.) charge pumped refresh. (By "static" memory cell is meant a memory cell in which the memory states do not become degraded with the passage of time.) However, the cross-coupled static cell is rather complex in structure. Moreover, an undesirably large amount of external standby power is required for maintaining and refreshing the memory states because, in order to get rid of a relatively small amount of spurious electrical charge, a relatively large amount of charge must be continually shifted by the A.C. pump.

Accordingly, it would be desirable to have a memory cell in which the refresh network is independent of the access reading and writing and which requires relatively low refresh standby power.

SUMMARY OF THE INVENTION

In order to provide an independent refresh to a memory charge storage capacitor, a first terminal portion of the capacitor is connected to one of the high current carrying terminals of a first switching transistor in a refresh network which is separate from a read-write access network for said capacitor. Another high current carrying terminal of the first switching transistor is connected to a suitable voltage source acting as a sink for spurious background electrical charges being accumulated in the memory capacitor. By "high current carrying terminal" is meant, for example, the source or drain of an insulated gate field effect transistor (IGFET), or the emitter or collector of a bipolar transistor. A low current carrying terminal of the first switching transistor is connected to a high current terminal of a second switching transistor thereby controlling the first switching transistor. Another high current terminal of the second switching transistor is connected to the first terminal of the memory capacitor, and a low current terminal of the second switching transistor is connected to a different terminal of the capacitor. By "low current carrying terminal" is meant, for example, the gate electrode terminal of an IGFET or the base terminal of a bipolar transistor.

The capacitor has two memory states, one characterized by an empty or nearly empty capacitor (digital 0) and the other by a full or nearly full capacitor charge state (digital 1). In the digital 0 state, spurious charge due to background charge generation in the semiconductor, for example, is continually removed from the capacitor through the first switching transistor to the voltage source acting as a sink for spurious charges being generated in the capacitor. In the digital 1 state, the first switching transistor is kept "Off" so that the charge is not removed from the capacitor, and the background charge being generated in the semiconductor merely acts to maintain this digital 1 state. In this way, the binary digital memory state of the capacitor is preserved, as previously determined by the semiconductor portion of the capacitor's being empty of charge vs. being full of charge; and the capacitor can be read or written independently of refresh.

In a specific embodiment of the invention, a transistor memory cell includes an MIS (metal-insulator-semiconductor) capacitor memory element, more specifically an MOS capacitor element. The MOS capacitor is gated for useful access (reading and writing) by a gating transistor $T_1$, typically an insulated gate field effect transistor (IGFET). A portion of the surface region of a monocrystalline semiconductor substrate chip provides the semiconductor region of the MOS capacitor, and the gating IGFET is also integrated in another portion of the same substrate. The semiconductor region of the MOS capacitor is connected to the source regions of both of a pair of first and second switching transistors, $T_2$ and $T_3$, both typically of the IGFET type, also integrated in the same substrate. One of the switching transistors ($T_2$) has its drain region connected to an A.C. "refresh line," and its gate electrode connected to the drain of the other IGFET ($T_3$). The gate electrode of this other IGFET ($T_3$) is connected to a D.C. voltage source which advantageously also maintains the same D.C. voltage potential on the metal plate of the MOS structure. This D.C. voltage on the metal plate of the capacitor is of negative polarity for an N-type semiconductor substrate surface portion in the MOS capacitor, positive for P-type. The semiconductor surface portion of the MOS capacitor is thus subjected to a reverse bias voltage (positive polarity for N-type semiconductor) relative to the metal plate, thereby ensuring the continued formation of a depletion layer in the MOS capacitor portion of the surface region of the semiconductor substrate during operation. The refresh line, to which the drain of the transistor $T_2$ is connected, is an electrically conductive line controlled by an A.C. voltage "refresh" source, such that the refresh line voltage varies at an A.C. frequency between potentials $V_1$ and $V_2$, where $V_1$ is conveniently approximately equal to the D.C. voltage applied to the plate of the MOS structure, and $V_2$ is a voltage typically about 5 to 10 volts different from $V_1$. More specifically, $V_2$ is electrically more negative than $V_1$ for an N-type semiconductor surface portion in the MOS capacitor, and $V_2$ is more positive than $V_1$ for P-type. Advantageously, the drain to gate electrode electrical capacitance $C_2$ (ordinarily due to parasitics, for example) of the first switching transistor ($T_2$) is advantageously greater than the capacitance ($C_3$) of the second switching transistor ($T_3$). The larger of these electrical capacitances $C_2$ (of $T_2$) is itself advantageously less than the capacitance $C_S$ of the MOS capacitor by a factor of 5 or more. In this way, the spurious charges in the memory element, such as thermally generated minority carriers in the semiconductor substrate of the MOS capacitor, are continually removed by the refresh line and delivered to the A.C. refresh source acting as a sink for these spurious charges. Reading and writing through the gating transistor ($T_1$) can be performed as ordinarily in the prior art, but now at any desired moment of time independent of refresh.

Alternatively, the refresh line of the above described circuit is held at the D.C. potential while the metal plate of the MOS capacitor is subjected to an applied A.C. voltage excursion, the semiconductor substrate being held at a reverse bias D.C. voltage, thereby reducing the magnitude of the required A.C. voltage excursion ("swing") while maintaining a depletion region in the MOS capacitor portion of the semiconductor surface operation. In yet another alternative, both the refresh line and the metal plate of the MOS capacitor are held at D.C. potentials while the semiconductor substrate is subjected to an applied A. C. voltage which swings about an average valve such that a depletion layer is maintained in the MOS capacitor portion of the surface of the semiconductor during operation.

An array of these memory cells, each controlled by separate gating and switching transistors, can be integrated in the same semiconductor chip together with an A.C. oscillator for the refresh line pump source, for a large scale memory in accordance with integrated circuit techniques.

Moreover, it is desirable that the A.C. refresh voltage, being continuously delivered to all cells on a single semiconductor chip, be interrupted whenever any cell on that chip is being accessed for write-in. Thereby, the possibility of spurious water-in due to the A.C. refresh voltage is avoided.

The advantages of this invention thus include the fact that useful access for reading and writing of the MOS memory cell can be performed at any time (independent of refresh). Thus, the memory is ready and available for write-in including erase, as well as readout, at all times. There is thus also no need in this invention for complicated program control over external access, otherwise necessitated by the refresh intervals of much of the prior art. In addition, the standby power required for refresh is minimized, since only the undesired thermally generated carriers are removed from the memory cell. In this invention the entire charge corresponding to a digital 1 (fully charged MOS memory cell) does not now have to be shifted during every refresh, contrary to the prior art, thereby requiring lower standby power. Moreover, since the frequency of refresh in this invention can be as high as 100 KHz or more in a dynamic memory configuration, a higher operating temperature (shorter semiconductor thermal regeneration time) can be tolerated, thereby easing the heat-sink problem; or alternatively, by using the lower range of operating temperatures of the prior art in conjunction with this invention, localized undesired high "dark" current background sources (corresponding to "white video defects" in imaging devices) can be better tolerated in the practice of this invention. Finally, in this invention, the memory cell during operation automatically is either full or empty of electrical charges; whereas in much of the prior art, the readout networks must distinguish between a fully charged MOS cell (digital 1) and a cell which is unavoidably partially filled (digital 0) due to the thermally generated carriers in the semiconductor. Yet these carriers can ordinarily be removed only once every millisecond (otherwise, the available access time for reading and writing would be even more curtailed in this prior art). Thus, such a prior art cell is characterized by lower detection margins for the same storage capacitor cell size.

BRIEF DESCRIPTION OF THE DRAWING

This invention together with its features, advantages and objects can be better understood from the following detailed description when read in conjunction with the drawings in which:

FIG. 1.1 is a schematic circuit diagram of an MOS memory cell with refresh in accordance with an alternate embodiment of the invention;

For the sake of clarity only, none of the drawings is to any scale.

DETAILED DESCRIPTION

Figure 1:
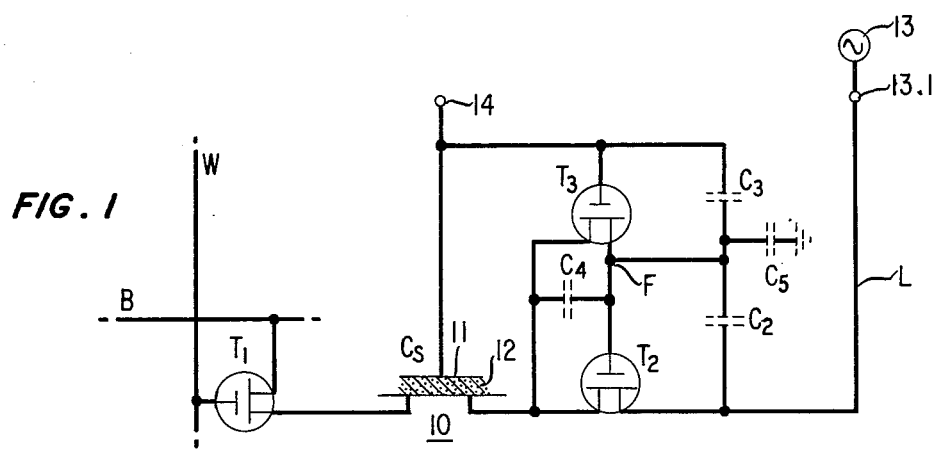
FIG. 1 is a schematic circuit diagram of an MOS memory cell with refresh, in accordance with a specific embodiment of the invention.

As shown in the circuit of FIG. 1, an MOS memory storage capacitor $C_S$ is formed by a metal (or metal-like) plate 11 separated by an oxide layer 12 from an N-type semiconductor substrate surface portion 10. The semiconductor substrate itself is advantageously reversed biased (not shown in FIG. 1). The metal plate 11 is directly coupled by ohmic connection to terminal 14 which is advantageously maintained at a constant negative D.C. voltage, $-V$, as by means of an external battery (not shown). This voltage $-V$ applied to terminal 14, in conjunction with the reverse bias voltage applied to the semiconductor substrate, produces a depletion region in the semiconductor region underneath the metal (or metal-like) plate 11. Write-in of digital 1 or 0 into the capacitor $C_S$ is controlled by a "P channel" access gating IGFET device $T_1$ whose gate terminal voltage is controlled by a word line W and whose source terminal voltage is controlled by a bit line B, as known in the art. Bit line B is normally set at the negative potential, $-V$; whereas, the word line W is set normally at ground.

The write-in of positive charge, i.e., digital 1, to capacitor $C_S$ is achieved by a positive-going pulse on bit line B applied to the source of $T_1$ (top side of $T_1$) accompanied by a negative-going pulse (turn "on") on the word line W applied to the gate of $T_1$, thereby filling the surface portion of the semiconductor substrate 10 in the region underneath the metal plate 11 with positive charge carriers ("holes"), in a quantity given by $C_S V$ (where V is the D.C. supply at terminal 14). Removal of the negative pulse to the gate of $T_1$ prior to the termination of the positive pulse to the source of $T_1$ thereby traps these positive charges in this substrate of capacitor $C_S$ by turning "off" the transistor $T_1$. This "off" condition persists after a return of bit line B to its normally negative voltage bias condition. Thus, the long-term nonvolatile trapping and storage of this digital 1 state in $C_S$ is achieved.

The write-in of a digital 0, i.e., substantially no charge in MOS capacitor $C_S$, is accomplished by a negative-going pulse on word line W to turn "on" $T_1$ while bit line B remains at its normally negative voltage. Thereby, the capacitor $C_S$ is emptied of any positive charges in the surface portion of substrate 10 associated with $C_S$ (underneath metal plate 11).

Readout of the charge state 1 or 0 of $C_S$ is accomplished by a negative turn "on" pulse applied to word line W with bit line B still in its normally negative bias condition, thereby transferring positive charge (if any) from $C_S$ into bit line B for conventional readout and followed by re-write if desired, as is known in the art. However, as time passes in the absence of refresh means, the thermal generation of minority carriers ("holes") would tend to fill an empty $C_S$ (digital 0) with undesired positive charge, thereby spuriously converting the memory state to a full capacitor $C_S$ (digital 1) and completely degrading the memory state.

The purpose of the auxiliary network of switching P-channel IGFETs $T_2$, $T_3$, with capacitors $C_2$, $C_3$, $C_4$ and $C_5$, in combination with an electrical refresh lines L controlled by an A.C. pump power supply source 13 applied to terminal 13.1, is to maintain the empty 0 state, as well as the full 1 state, of $C_S$ in the absence of any further write-in voltage pulses on either the word line W or the bit line B; thereby preventing degradation of the memory state without need during operation for any tampering with the word line W or the bit line B for any refresh purpose (as opposed to the purpose of external access reading or writing). Ordinarily, the capacitors $C_2$, $C_3$, $C_4$ and $C_5$ are parasitics, and are therefore indicated in the drawing by dotted lines. Advantageously for this refresh purpose, the A.C. voltage source 13 supplies a continuous uninterrupted (except as described below) alternating voltage, at a frequency of between about 10 KHz and 1 MHz, to the refresh line L, advantageously varying approximately between the limits of $-V$ and $-(V+\Delta)$, where $-V$ is the same voltage as applied to terminal 14 and $\Delta$ is typically in the range of about 5 to 10 volts, advantageously about 8 to 10 volts. Typically, $-V$ is about $-12$ volts; however, during "down" operation (no reading or writing), $-V$ can be reduced to as low as about $-5$ volts.

Although, hereinafter the limits of the A.C. source 13 will thus be described as $-V$ and $-(V+\Delta)$; nevertheless, it should be remarked that these limits can be advantageously set at $-(V+V_T)$ and $-(V+V_T+\Delta)$ where $V_T$ ($<0$) is the sum of the threshold voltage of $T_2$ and $T_3$ (where $T_2$ usually predominates). These latter limits can be achieved by means of a free running oscillator which feeds a bootstrap type integrated driver circuit, as described for example in a paper by R. E. Joynson et al, IEEE Journal of Solid State Circuits, Vol. SC-7, No. 3 pp. 217–224 (June 1972) entitled: "Eliminating Threshold Losses in MOS Circuits by Bootstrapping Using Varactor Coupling." The upper and lower voltage limits of the A.C. source can both be simultaneously lowered for a given A.C. excursion $\Delta$ (peak to peak). The output of the A.C. source 13, in any event need not be in phase with, or synchronized with, any other voltage sources. The transistor $T_2$ has its drain terminal (right-hand side of $T_2$) directly D.C. ohmically coupled to refresh line L by way of a highly conductive ohmic path. The gate electrode of $T_2$ is directly D.C. ohmically coupled to the drain terminal of $T_3$. The gate electrode of $T_3$ is directly D.C. ohmically coupled to the terminal 14 (which also controls the plate voltage of $C_S$). The node F (at the gate electrode of $T_2$) is A.C. coupled by (parasitic) capacitances $C_2$, $C_3$, $C_4$, and $C_5$ associated with this node F as follows: to the refresh line L through the capacitance $C_2$, to the gate electrode of $T_3$ through the capacitance $C_3$, to the source of $T_2$ through the capacitance $C_4$, and the remaining parasitic to ground through the capacitance $C_5$. Advantageously, the capacitance $C_2$ is greater than $C_3 + C_4 + C_5$; however, capacitance values of $C_2$ somewhat less than this can be used in conjunction with larger voltage excursions $\Delta$. The capacitance $C_2$ is advantageously significantly less than the MOS capacitance $C_S$, advantageously by a factor of 5 or more, in order to minimize the required value of the voltage swing $\Delta$.

In the following description of operation, it will be assumed that $T_3$ is designed to have a threshold gate voltage which is more negative than that of the MOS capacitor under the same source and drain voltage conditions. This "higher" threshold condition for $T_3$ is not essential, however, as will be discussed below. This higher threshold can be achieved by such known techniques as ion implantation (of donor impurities for P channel), increased oxide thickness, or geometrical design effects, as known in the art. Advantageously, the threshold of $T_3$ is only slightly more negative than that of the MOS capacitor, typically by only about 0.5 to 1.0 volts. The peak to peak swing $\Delta$ of the A.C. voltage on the refresh line L is advantageously equal to or greater than about twice the threshold voltage of $T_2$. Typically, this swing $\Delta$ is in the range of about 5 to 10 volts or more.

While the refresh line L oscillates in voltage between $-V$ and $-(V+\Delta)$, the A.C. voltage division produced by capacitors $C_2$ and $C_3+C_4+C_5$ (where $C_2 > C_3+C_4+C_5$) is such that little of the A.C. voltage drop between source 13 and terminal 14 appears across $C_2$. This tends to cause the gate voltage of $T_2$ and the drain voltage of $T_3$ to follow quite closely the oscillating voltage on L provided that the transistor $T_3$ is "off," that is, its gate semiconductor surface region is not inverted from its source to its drain. In this way, the memory state of $C_S$ is preserved, in terms either of a fully charged capacitor (with the charge equal to $C_SV$) or of an empty capacitor, as can be seen from the following explanation.

Assuming the memory cell is in its digital 0 state ("empty cell"), then the memory capacitor $C_S$ is empty, or nearly empty, of charge in the portion of the surface of the semiconductor substrate under plate 11. Then, thermal generation of charge in the semiconductor undesirably tends to increase this charge in the positive sense, thereby producing spurious charge in the memory capacitor. Moreover, undesired positive charge on the gate of $T_2$ also tends to be generated. However, the spurious positive charge being generated in a nearly empty capacitor $C_S$, as well as any undesirable charge on the gate of $T_2$, will be drained off and collected by the refresh line L thereby acting as a charge sink for the spurious charge as follows. Due to the fact that $C_S$ is empty or nearly empty of charge, the transistor $T_3$ is "off," except when the refresh voltage on the line L goes to $-V$, i.e., its most positive excursion. More specifically, $T_3$ then turns "on" at the positive excursion of refresh line L if there is an undesired positive charge accumulation on the gate of $T_2$. Thus, on the positive excursion of L (at and near $-V$), when $T_3$ is temporarily "on," any unwanted positive charge which has accumulated on the gate of $T_2$ is transferred through $T_3$ into $C_S$. Thereby, the voltage on the gate of $T_2$ is prevented (on every cycle of L) from becoming more positive than $-V-V_{T3}$, where $V_{T3}$ is the (negative) threshold turn-on voltage of $T_3$. On the negative excursion of the refresh line L (i.e., at or near $-V-\Delta$), the gate of $T_2$ is made more negative by virtue of the coupling capacitance of capacitor $C_2$. For a sufficiently large $\Delta$, $T_2$ turns "on," thereby enabling the spurious positive charge (both the previously transferred charge from the gate of $T_2$ and thermally generated charge) in the substrate of the memory capacitor $C_S$ to flow into the line L itself. Summarizing this operation, with $C_S$ empty or nearly empty (digital 0), on the positive excursion of refresh line L any undesired positive charge on the gate of $T_2$ is transferred through $T_3$ into $C_S$; whereas on the negative excursion of L, any of that positive charge which was just transferred to the substrate of $C_S$ from the gate of $T_2$ (on the previous positive excursion of L) plus any spurious positive charge which has been thermally generated in the substrate of $C_S$ is all transferred through $T_2$ to the refresh line L (where it is returned ultimately to the power supply 13). Thus, a nearly empty cell is continually refreshed to remain an empty cell on each cycle of the power supply 13.

In the case of a digital 1 ("full cell") i.e., the semiconductor substrate surface portion 10 of the capacitor $C_S$ has a positive charge equal to, or nearly equal to, $C_SV$; therefore, $T_3$ is always "on" regardless of the voltage excursion of refresh line L between $-V$ and $-V-\Delta$. Accordingly, since $T_3$ is always "on," the gate of $T_2$ is maintained at the voltage of the positively charged semiconductor surface portion of the capacitor $C_S$, so that $T_2$ is always "off" regardless of the excursion of the line L. Thereby, the positive charge in the substrate of $C_S$ remains trapped because $T_2$ can never turn "on" during any portion of the A.C. cycles of the refresh line L.

It should be noted that the transistor $T_3$ controls the transistor $T_2$; that is, whatever is the state of charge in the memory cell, $T_2$ is turned "off" whenever $T_3$ turns "on" and $T_2$ is turned "on" whenever $T_3$ turns "off."

During external access, read or write, the word line W should normally be held at a potential of about 8 to 10 volts more negative than the threshold of the gating transistor $T_1$. Thus, during rewrite the current through $T_1$ will be much greater than that through $T_2$. Moreover, the current through $T_3$ when $T_2$ is "on" tends to turn $T_2$ "off," so that the success of attempted rewriting of the MOS capacitor will be ensured.

In the above descriptions of operation with a full and an empty cell, $T_3$ was assumed to have a higher threshold than both $T_2$ and the semiconductor portion of the MOS storage capacitor $C_S$, that is to say, $T_3$ requires a more negative-going gate voltage for turning "on" than does $T_2$. If this threshold condition is not satisfied, but the thresholds of $T_2$ and $T_3$ are about equal, then, when the refresh line L is on its negative excursion, $T_3$ will turn "on" even in the case of the empty cell during the same time that $T_2$ is also "on." The consequent flow of positive charge through $T_3$ then tends to turn $T_2$ prematurely and undesirably "off" during this negative excursion of L, thereby tending to prevent the desired complete emptying of $C_S$. This undesirable effect can be mitigated by utilizing a relatively high frequency of output for the A.C. power supply 13, typically of the order of at least 100 KHz to 1 MHz, thereby enabling the transistor $T_2$ to turn "on" more frequently, that is, during the more frequent negative excursions of L, as desired for more efficient and complete emptying of the positive charge in the capacitor $C_S$ substrate.

Nondestructive reading access (no rewrite required) may be achieved by holding the bit line B and word line W both normally at ground. Then for reading, a negative-going pulse is applied on W, sufficient to turn "on" $T_1$ slightly, but not sufficient for $T_3$ to turn $T_2$ "off." Thereby, during reading, $T_2$ will drain off from the MOS capacitor $C_S$ to the refresh line L all the reading current from $T_1$ then being delivered into the MOS capacitor, without changing the memory state of this MOS capacitor. However, the reading must then be performed during the negative phase of the excursion of refresh line L in order to enable refresh line L to drain off the reading charge continuously.

It can be seen from the circuit diagram of FIG. 1 that the node F undergoes a voltage excursion of but a fraction of the voltage excursion $\Delta$ of the refresh line L, namely, the fraction $\alpha = C_2/(C_2 + C_3 + C_4 + C_5)$. Thus the excursion $\Delta$ should be larger than the absolute value of ($V_{T2}/\alpha$). In order to increase the fractional excursion of the node F relative to the applied A.C. source, an alternative circuit shown in FIG. 1.1 can be employed in which the refresh line L is held at a fixed D.C. potential at its terminal 13.1 whereas an A.c. source 14.1 is applied via terminal 14 to the plate 11 of the storage capacitor $C_S$. In this way, the required excursion $\Delta$ of the A.C. source 14.1 can be made somewhat smaller typically an excursion as low as about 4 volts, because the parasitic capacitance $C_5$ now aids $C_2$ in keeping the node F at the refresh line's potential. More specifically, in the circuit of FIG. 1.1, the terminal 13.1 of the refresh line L is connected to a D.C. source (not shown) of voltage $-V$, the same voltage as previously applied to the terminal 14 in the circuit of FIG 1; whereas an A.C. voltage source 14.1 (FIG. 1.1) supplies a oscillating voltage at terminal 14 to the metal plate 11 of the storage capacitor $C_S$. This A.C. voltage source advantageously provides a voltage which continuously oscillates between $-V$ and $-V+\Delta$, where $\Delta$ is equal to or larger than the absolute value of $V_{T2}/\beta$, where $\beta = (C_2 + C_5)/(C_2 + C_3 + C_4 + C_5)$. Typically, $\Delta$ is about 6 volts. In this case, there is no need for a bootstrap device in conjunction with the A.C. source, since the A.C. voltage never need go more negative than $-V$. Thereby, the refresh line L in the circuit of FIG. 1.1 again acts as a sink for spurious memory cell charges as in the circuit of FIG. 1 while the A.C. voltage source acts as charge-pump tending to force these spurious charges into the sink.

Alternatively, the terminals 13.1 and 14 can both be maintained at D.C. voltage $-V$ while the substrate 10 is connected to an A.C. voltage source, typically having an A.C. excursion $\Delta$ of about 10 volts (peak to peak) with an average D.C. level of about +5 volts for N-type semiconductor substrate 10. Again the refresh line L will then collect and act as a charge-sink for spurious charges accumulating in the storage cell $C_S$ while the A.C. voltage source acts as a pump tending to force these charges into the sink; and again the semiconductor surface portion underneath the metal-like plate 11 will be depleted during operation while the substrate is thus being A.C. pumped.

Figure 2:
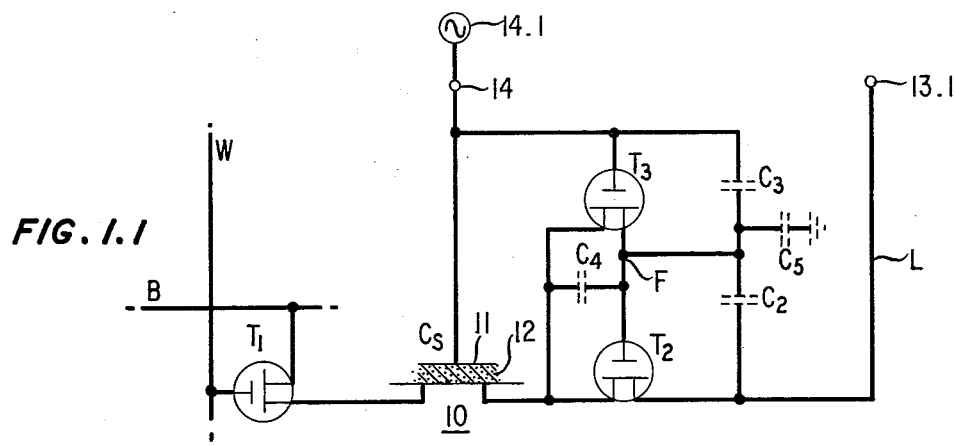
FIG. 2 is a top view of an integrated circuit version of the MOS memory cell diagrammed in FIG. 1.
Figure 2:
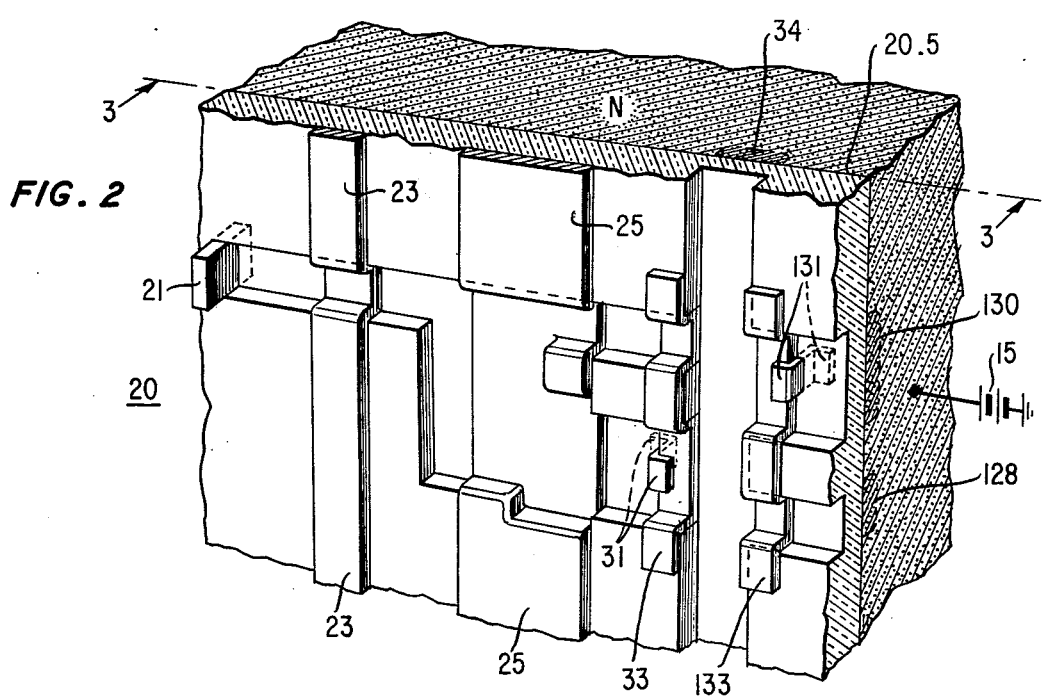
Figure 3:
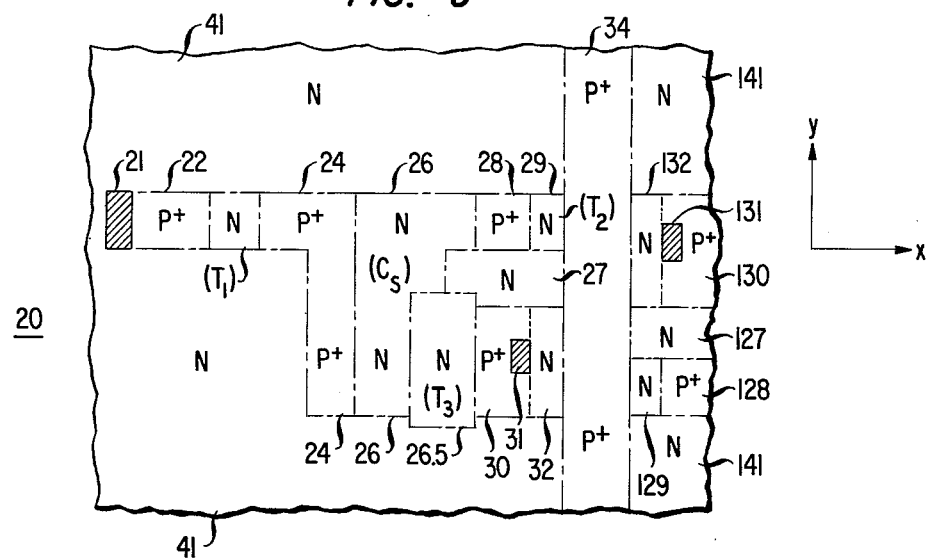
FIG. 3 is a top view in cross section of the MOS memory cell integrated circuit shown in FIG. 2.

A specific integrated circuit embodiment of the its thick ). invention is shown in FIGS. 2 and 3. FIG. 2 is a top view of this specific embodiment with both the second level insulator oxides and "second level" conductor metallizations removed for the sake of clarity; whereas FIG. 3 is a top cross-section view of the surface at the semiconductor substrate of this same specific embodiment. More specifically, FIG. 2 shows the embodiment during an intermediate stage of it fabrication, at a time when there is present a relatively thich oxide coating with relatively thin oxide portions, plus the subsequently deposited "first level metallization" of gate electrodes typically of electrically conductive polycrystalline silicon ("polysilicon"), By "thick oxide" is meant silicon dioxide between about 5,000 Angstroms and about 15,000 Angstroms, typically about 13,000 Angstroms, that is, a suitable thickness for the higher negative threshold (by about 20 volts) field oxide of IGFET transistors; whereas by "thin oxide" is meant between about 500 and about 1500 Angstroms, typically about 1,000 Angstroms, that is, a suitable thickness for the gate oxide of lower threshold IGFET transistors. The thick oxide is also advantageously sufficient to act as a mask against the diffusion of a suitable acceptor impurity to render the corresponding semiconductor surface portions P+ type in those thin oxide regions which are not also masked by the polysilicon. In FIGS. 2 and 3, a single complete memory cell with refresh according to the invention is shown, together with a left-hand portion of a similar reversed mirror image cell located at the right-hand edge of the drawings, with similar elements of the mirror image cell labeled with the same reference numbers as in the completely shown cell plus 100.

The semiconductor chip substrate 20 is essentially a single monocrystalline N-type conductivity silicon chip of substantially uniform electrical resistivity corresponding to a uniform doping with $10^{15}$ arsenic impurity atoms per cubic centimeter, except as otherwise indicated in FIG. 3 both where a donor ion-implanted (somewhat more strongly N-type) surface zone 26.5 is situated and where strongly P-type zones labeled P+ are situated. A D.C. battery 15, typically of about 5 volts, supplies to the substrate 20 a reverse bias (positive polarity for an N-type semiconductor substrate). A metallic contact 21 to a P+ semiconductor surface zone 22 is connected to the bit line B (FIG. 1) of the second level metallization to external access circuitry (not shown in FIGS. 2 and 3 for clarity only), as known in the art. Thereby, the electrically conductive P+ surface zone 22 in a corresponding surface portion of the semiconductor is connected to, and controlled by, the bit line of the second level metallization. The P+ zone 22 also serves as the source region of transistor $T_1$. A word line 23 (W in FIG. 1) is furnished by a metal-like polycrystalline silicon ("polysilicon") electrode strip 23. This electrode strip 23 also overlies a portion of thin oxide at the right-hand edge of P+ zone 22, so that the N-type gate ("P-channel") region of the gating transistor $T_1$, located between P+ zones 22 and 24, is controlled by the potential on this strip 23. At the right-hand edge of this gate region of $T_1$ is located the P+ surface zone 24 under thin oxide. This P+ zone 24 serves the dual role as the drain region of transistor $T_1$ as well as an electrically conductive interconnection to the MOS storage capacitor $C_S$. An N-type semiconductive surface zone 26 of the capacitor $C_S$ also lies underneath thin oxide. The left-hand edge of this N type zone 26 is defined by the contour of a polysilicon electrode 25 overlying the oxide 20.5. At the lower right-hand corner of N zone 26 is located a donor ion-implanted N-type zone 26.5, so that this N zone 26.5 has a somewhat higher concentration of excess donors and hence a somewhat more negative threshold voltage than the N zone 26. Typically, the threshold voltage of zone 26.5 is about 0.5 volts more negative than that of zone 26. It should be noted that instead of ion implantation, the increased threshold for zone 26.5 can be achieved alternatively by means of a slightly (10 percent to 30 percent) thicker oxide overlying this zone 26.5 than the thin oxide overlying the surface zone 26. Zone 26.5 serves as the gate region of $T_3$, while a portion of zone 26 bordering on zone 26.5 serves as the source region of $T_3$. As discussed previously, this ion-implanted zone 26.5 is optional, and its location can be alternatively filled with an extension of the zone 26 under the polysilicon electrode 25. The right-hand edge of the polysilicon electrode 25 thus overlies and defines the upper right-hand edge of zone 26 (that is, the right-hand edge of zone 26 excpet where the left-hand edge of the ion-implanted zone 26.5, if any, is located, and except where the left-hand edge of a thick oxide overlain N-type surface region 27 is located).

The rectangularly shaped N-type surface region 27 underlies a thick oxide region of the layer 20.5 (FIG. 2). This N region 27 (FIG. 3) is thus characterized by a more negative threshold voltage, typically by about 20 volts, than the N zones 26 or 29 or even N zone 26.5. The P+ zone 28 serves as the source of $T_2$; whereas the P+ zone 30 serves as the drain of $T_3$, and the N zone 29 serves as the gate region of $T_2$. The N region 27 separates the pair of N-type surface zones 29 and 32 located underneath a portion of a polysilicon electrode 33. This electrode 33 serves as the gate electrode of $T_2$. The N region 27 is located underneath thick oxide, whereas the N zones 29 and 32 are located underneath thin oxide; therefore, the N region 27 is characterized by the higher negative threshold (by about 20 volts) than any of the N zones 26, 26.5, 29 and 32. An ohmic metallic contact 31 connects the P+ zone 30 with the polysilicon electrode 33. Finally, a P+ surfaces zone strip 34, a portion of whose left-hand edge underlies in advantageous registry with the right-hand edge of the polysilicon electrode 33, runs in the plane of the drawing vertically across FIGS. 2 and 3. This P+ zone strip 34 serves as the refresh line L, and a portion of the left-hand extremity of this strip 34, contiguous to the right-hand edge of P+ zone 29, serves as the drain of $T_2$.

Even though the oxide thickness underneath the electrode 33 is the same in N zone 29 as in N zone 32; nevertheless, during operation the N zone 32 will never have a conducting surface inversion (channel) layer extending from the P+ zone 30 to the refresh line 34, due to the ohmic contact 31 connecting this P+ zone 30 with the gate electrode 33. Capacitor $C_2$ is the parasitic edge capacitance between the gate electrode 33 and the refresh line 34. For the sake of simplicity only in the drawings of FIGS. 2 and 3, the left-hand and right-hand edges of the refresh line 34 are straight lines. However advantageously in order to increase the capacitance $C_2$ relative to $C_3$, the right-hand extremity of the gate electrode 33 extends somewhat (typically by 1 micron or more) to the right beyond the right-hand extremity of the underlying thick oxide. Moreover, the right-hand edge of the gate electrode 33 is made serpentine in order to increase the length of the edge and hence the edge capacitance $C_2$. In this way, $C_2$ can be made larger than $C_3 + C_4 + C_5$ as is desired (although not essential). Thus, the layout just described in FIGS. 2 and 3 represents an integrated circuit version of the schematic electrical circuit shown in FIG. 1.

It should be understood that the P+ strip 34 also serves as the refresh line for the reverse mirror image device located immediately to the right-hand side of this strip, as well as serves as the refresh line for many other similar devices integrated in the same wafer 20 above and below that shown in FIGS. 2 and 3, in accordance with "large scale" integrated circuit technology. The free running oscillator circuit, together with its bootstrap driver circuit, associated with the A.C. pump source 13 (not shown in FIGS. 2 and 3) can also be integrated in the same wafer 20 in accordance with known integrated circuit technology.

Figure 4:
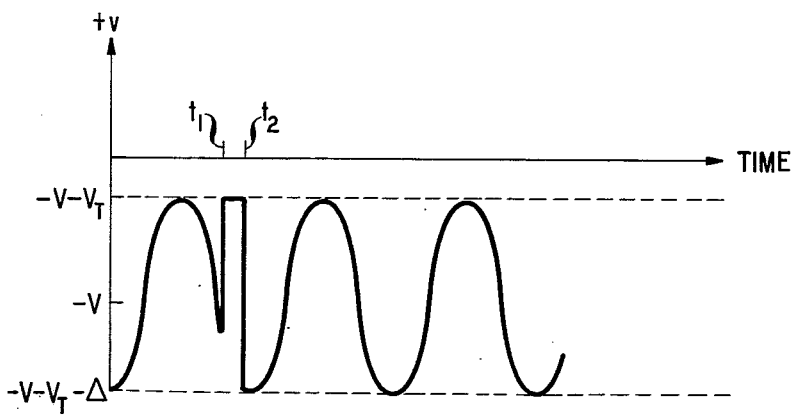
FIG. 4 is a plot of refresh line voltage vs. time, useful in describing the operation of a specific embodiment of the invention.

It should be noted that, unless measures to be discussed are adopted, spurious write-in can occur in the circuits of FIG. 1 and FIG. 1.1 in case the threshold voltage of N zone 26.5 ($T_3$) is not sufficiently (by about one volt) more negative than the threshold voltage of the N zone 26 ($C_S$), in the presence of appreciable capacitance $C_2$. More specifically if the storage capacitor $C_S$ is being subjected to a write-in of a binary digital 0 (empty cell) during a time interval $t_1 t_2$ occurring at or near the most negative portion of a refresh line cycle, then the storage capacitor $C_S$ will draw a spurious charge due to displacement current in $C_2$ serially through $T_3$, regardless of the desired write-in. This charge may be sufficient thereafter to cause $T_3$ to prevent $T_2$ from turning "on," thereby preventing the storage capacitor $C_S$ from emptying itself of the spurious charge thereafter (subsequent to $t_1 t_2$) and thereby enabling the storage capacitor $C_S$ to become spuriously filled with thermally generated charge. Thus, the memory cell becomes spuriously written with and stores a digital 1 (full cell) even through the desired write-in was a digital 0. In order to avoid such spurious write-in, as indicated in FIG. 4, the A.C. refresh line voltage v (being delivered to the refresh line L in FIG. 1) is suddenly interrupted and set to the fixed level $-V - V_T$ (where $V_T = V_{T2} + V_{T3}$) for the whole time interval $t_1 t_2$ within which the storage cell $C_S$ is being accessed for write-in. Typically, the write-in access time is of the order of 200 nanoseconds whereas the period of the A.C. pump source 13 for refresh is of the order of tens of microseconds, so that the interval $t_1$ to $t_2$ is ordinarily much less than a single A. C. cycle of the source 13. Thereby, spurious write-in during access is prevented.

Figure 5:
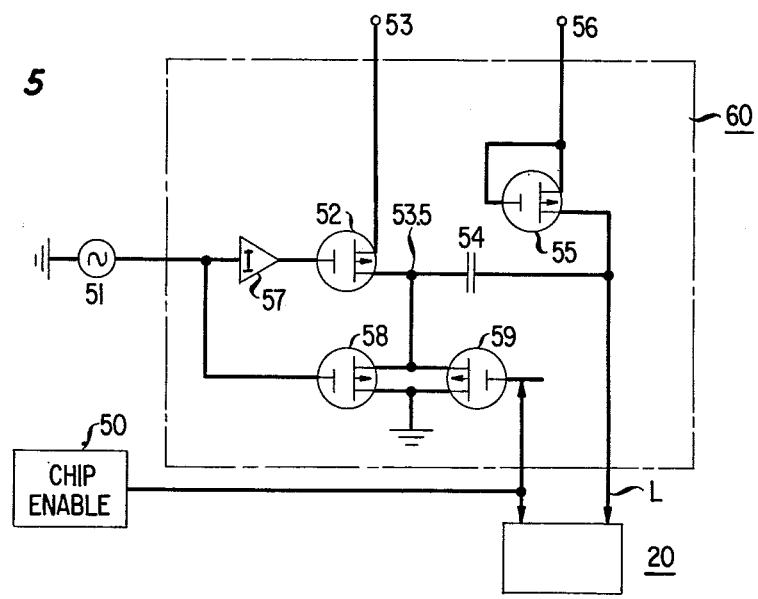
FIG. 5 is a circuit diagram of a refresh line voltage source useful for the operation of a specific embodiment of the invention.

FIG. 5 illustrates a typical circuit arrangement for providing the refresh line voltage characteristic of FIG. 4. In FIG. 5, the semiconductor chip 20 contains an array of many of the storage cells, typically about 4,000 cells, each cell of the type shown in FIGS. 2 and 3; and the chip 20 typically contains the memory refresh line L, branching out for different columns of cells (not shown). Whenever any cell on the chip is to be accessed for write-in (or perhaps read-out too), a chip enable signal source 50 delivers a signal to the chip 20 in order to enable this chip to be accessed for write-in (or read-out) along a selected word line and a selected bit line (not shown for purposes of clarity only). At the same time, this chip enable signal is also delivered to the gate of an insulated gate field effect transistor 59 in an electrical network 60 for providing the desired interrupted A.C. refresh line voltage.

The network 60 also includes an A.C. voltage source 51, which supplies a continuous A.C. output voltage sufficient to turn transistors 52 and 58 "on" and "off" alternately. This A.C. output is delivered to the gate of the insulated gate field effect transistor 58 and to the input terminal of an inverter 57. The drain of the transistor 52 is connected to a terminal 53 at which the steady D.C. voltage $-V$ is applied, typically $-12$ volts. The source of the transistor 52 is connected both to a voltage level-shifting capacitor 54 and to the drains of insulated gate field effect transistors 58 an 59. The gate of the transistor 52 is connected to the output terminal of the inverter 57. Advantageously, the z/l (channel width to length) ratio of transistor 52 is much less than that of transistor 59. The level-shifting capacitor 54 couples as the source of transistor 52 with the source of a clamping transistor 55. The gate and drain of the transistor 55 are both connected to a terminal 56 to which the steady D.C. voltage $-V$ is applied. Thereby, the refresh line L is maintained at the desired voltage vs. time characteristic shown in FIG. 4.

The operation of the network 60 may be described as follows. The A.C. oscillator 51 supplies an A.C. output voltage oscillating between about ground to $-12$ volts. This A.C. output voltage alternately turns transistor 52 "on" or "off," while alternately turning transistor 58 "off" and "on" (due to the inverter 57). At the same time, in the absence of any chip enable signal, the transistor 59 remains "off." Thereby, node 53.5 oscillates in voltage between ground and about $-12$ volts. By reason of the voltage level-shifting capacitor 54 and the clamping transistor 55, the refresh line voltage thus oscillates typically between about $-9$ and $-17$ volts, that is, an excursion which is equal to $\beta V$ where $\beta$ (less than unity) is the ratio $C_B/(C_B + C_L)$, in which $C_L$ is the capacitance of the refresh line load, and $C_B$ is the bootstrap capacitance. However, if and when a chip enable signal is forthcoming, then transistor 59 is turned "on," thereby grounding the node 53.5 regardless of the state of transistor 52 and thereby forcing the potential of the refresh line L substantially to $-V - V_T$ for the duration of the chip enable signal, since the resistance of transistor 52 is much greater than that of transistor 59 (as determined by the relative 2/1 ratios). It should be understood that the A.C. output to the refresh line L supplied by the circuit shown in FIG. 5 will not necessarily be of sinusoidal profile, but this does not in any way adversely affect the performance.

It should also be mentioned that when using the A.C. refresh pumping in accordance with the circuit shown in FIG. 1.1, or with the above described substrate A.C. pumping, the A.C. voltage is advantageously interrupted during write-in access intervals in a similar manner as indicated in FIG. 4. The network 60 can be integrated into the chip 20 in accordance with state of the art semiconductor integrated circuit fabrication techniques.

In order to fabricate an array of memory cells in accordance with this invention in a single silicon wafer substrate, one may proceed as follows. Although the steps will be described in terms of the fabrication of but a single memory cell, it should be understood that many such cells are being formed simultaneously in the single wafer substrate as in the ordinary integrated circuit art. A useful starting material is a wafer of monocrystalline semiconductive silicon oriented (1, 1, 1) which is uniformly doped with $10^{15}$ arsenic impurities rendering the silicon of moderately N-type conductivity. The surface of the silicon wafer is first cleaned and subjected to an oxidation process at an elevated temperature of about 1050° C for about 310 minutes, to form a thick oxide layer coating of about 13,000 Angstroms. Then a window in the oxide is formed, for example, by the technique of electron beam lithography followed by chemical etching, thereby exposing the semiconductor substrate in region 26.5. Next, ion implantation of 30 kev phosphorous ions is carried out through the window. Thereby, region 26.5 is implanted with a surface concentration of $2 \times 10^{11}$ phosphorous ions per square centimeter. Next, again the technique of electron beam lithography for selective masking followed by chemical etching is used to open windows in the thick oxide in the region where thin oxide is to be present. It should be remembered that it is the contour of this thin oxide-thick oxide boundary intersection which is indicated in FIG. 2. Thereby, the silicon substrate is exposed in these windows corresponding to thin oxide to be formed. The exposed silicon is then oxidized by means of a dry hydrochloric acid process at an elevated temperature of about 1100° C for about 30 minutes, to form a thin oxide of about 1,000 Angstroms in thickness. Next, polysilicon is deposited all over the top surface of the silicon wafer, typically at about 760°, to form a polycrystalline silicon coating of about 8,000 Angstroms in thickness. As deposited, this polysilicon coating typically does not necessarily contain any purposeful impurities. In order to render the polysilicon of sufficiently high electrical conductivity to minimize electrical losses during operation, phosphorus diffusion into the polysilicon coating is carried out, typically at about 1,000° C for 35 minutes, so that the polycrystalline silicon becomes of $N^+$ (strongly N) type conductivity. In order to protect the polysilicon during further processing, an oxide layer, typically of about 5,000 Angstroms in thickness is then formed to cover the polysilicon coating, typically by oxidizing the polysilicon steam at about 1050° C for about 50 minutes to form a 5,000-Angstrom-thick oxide layer. Next, once again the process of electron beam lithography for selective masking followed by chemical etching is used to selectively remove both the oxide overlying unwanted polysilicon and polysilicon itself in accordance with the desired polysilicon electrode pattern for the electrodes 23, 25 and 33. This etching is continued for sufficient time to expose the silicon substrate where the polysilicon has been removed in regions of thin oxide (1,000 Angstroms) but not thick oxide (13,000 Angstroms). Then a diffusion of boron impurities into the top surface of substrate produces all the desired $P^+$ zones. Next an oxidation of the substrate is carried out in steam at about 1050° C for about 5 minutes to produce a good quality thin oxide layer of about 1,000 Angstroms of silicon dioxide. This good quality oxide advantageously forms an interface with the previously exposed silicon substrate portion, which is relatively free of undesired interface states. At this stage in the processing, the appearances of FIG. 2 is obtained, except for the metallic contacts 21 and 31. Then a chemical vapor deposition of silicon dioxide at a substrate temperature of about 850 degrees C is carried out to coat the previously grown oxide with a silicon dioxide layer of about 11,000 Angstroms; thereby providing a protective insulated spacing (reduced parasitic capacitance) with respect to the second level metallization to be formed subsequently. Next, the back major surface (opposed the top surface) of the wafer 20 is stripped of oxide, by chemical etching, while the top surface with its oxide is protected from the etching by an etch-resistant mask. Then, an exposure of the back surface to phosphorous tribromide for about 35 minutes at 1000° C serves to getter impurities, such as sodium, out of the silicon substrate. Next, selective masking with electron beam lithography followed by chemical etching on the top surface selectively exposes small portions of the top surface of the silicon substrate thereby producing suitable contact windows for metallic contacts 21 and 31. Then a layer of aluminum is deposited, which is selectively removed, as by a process of electron beam lithography followed by chemical etching, in order to provide the metallic contacts 21 and 31 as well as the desired second level metallization pattern. Finally, the silicon wafer 20 is annealed in hydrogen, at a temperature of about 380° C for about 20 minutes.

Typical X and Y dimensions for the various elements are approximately

|  | X(microns) | Y(microns) |
|---|---|---|
| 21 | 7 | 7 |
| 22 | 7 | 7 |
| 23 | 7 | (extended) |
| 24 | 7 | 28 |
| 25 | 28 | (extended) |
| 26.5 | 14 | 16 |
| 27 | 21 | 7 |
| 28 | 7 | 7 |
| 29 | 7 | 7 |
| 30 | 7 | 14 |
| 31 | 3.5 | 7 |
| 32 | 7 | 14 |
| 33 | 7 | 38 |
| 34 | 7 | (extended) |

While this invention has been described in terms of a specific embodiment, various modifications can be made by those skilled in the art without departing from the scope of the invention. For example, the A.C. refresh voltage can be apportioned and applied simultaneously both to the terminal 14 (as in FIG. 1.1 and to the terminal 13.1 (as in FIG. 1). Such an apportionment may be required for error-free operation in case the parasitic coupling between the read/write circuitry and the metal plate 11-terminal 14 is strong enough to necessitate a reduced A.C. refresh voltage at terminal 14 (which reduced A.C. voltage is not sufficient by itself to refresh the memory cell). The A.C. refresh pumping of charge to maintain the memory state of the storage capacitor is thus determined among other factors, by the A.C. voltage difference applied across the terminals 13.1 and 14. It should be remarked that the refresh voltage used in FIG. 4 could be more negative at both upper and lower limits, while preserving the same A.C. excursion of Δ; and that the network 60 can be integrated into the chip 20 using known semiconductor integrated circuit techniques.

Other semiconductors, and their oxides or other insulators, such as germanium and its oxide, may be used instead of silicon and in an integrated circuit version of the invention. Moreover, the region 26.5 need not be specially formed out of the region 26, but instead this region 26.5 can be an extension of region 26; that is, transistor $T_3$ need not have a higher threshold than transistor $T_2$ as discussed previously, provided that the higher indicated frequencies are utilized for the A.C. source 13 during operation. It may be remarked that the extra area required by the refresh network in this invention, as illustrated in FIGS. 2 and 3, amounts only to about 20 to 30 percent of the area occupied in the semiconductor wafer by the conventional MOS cell formed by the MOS capacitor $C_s$, the gating transistor $T_1$ and the word and bit lines.

It should be understood that while the invention has been described in detail using P channel IGFET switching transistors $T_2$ and $T_3$ in the refresh network, other types of switching transistors, such as N channel IGFET transistors, bipolar transistors or junction field effect transistors, can also be used remembering that transistors generally have three terminals, two of them being relatively high current carrying terminals (source and drain in an IGFET, emitter and collector in a bipolar transistor) and one of them being relatively low current carrying terminal (gate electrode in IGFET, base in bipolar). Instead of an MOS capacitor as the memory element, other types of capacitors can be used, such as a semiconductor P-N junction capacitor, or a capacitor formed by a pair of metal plates separated by an insulator, which also suffers from spurious charging due to electrical charges coming from the transistor (semiconductor) control circuitry.

It should also be understood that although the substrate surface portion 10 is shown with two separated terminals for connection, respectively, to $T_1$ and to $T_2$ and $T_3$; nevertheless a single such terminal to the substrate portion 10 can be used. Thus, in FIG. 3, the $P^+$ zone 28 can alternatively extend through a channel to the $P^+$ zone 24.

What is claimed is:

1. Apparatus which comprises:
   a. a capacitor memory element capable of storing electrical charge to represent binary digital memory states of the element;
   b. a first electrical network means for providing access reading and writing signals to the element; and
   c. a second electrical network refresh means including first and second switching transistors, each having a pair of high current terminals and a low current terminal, one high current terminal of the first switching transistor being ohmically connected to a terminal of the memory element and the other high current terminal of the first switching transistor being ohmically connected to an electrically conductive refresh line, said refresh line having a refresh terminal means for the connection thereto of electrical means for acting as an electrical sink for spurious charges in the memory element during operation, one high current terminal of the second switching transistor being ohmically connected to the one high current terminal of the first switching transistor and the other high current terminal of the second switching transistor being ohmically connected to the low current terminal of the first switching transistor, the low current terminal of the second switching transistor being connected to a different terminal of the memory element.

2. Semiconductor apparatus in accordance with claim 1 in which the first and second switching transistors are insulated gate field effect transistors and in which the one and the other high current terminals are source and drain regions in the transistors, and in which the low current terminals are gate electrodes of the transistors.

3. Apparatus according to claim 2 in which the switching transistors and the capacitor are all integrated in a monocrystalline semiconductor substrate, the gate to drain electrical capacitance of the first switching transistor being less than the capacitance of the memory element.

4. Apparatus according to claim 3 in which the memory element is a layered structure of an electrically insulating layer sandwiched between a semiconductor layer portion of the semiconductor substrate and an electrically conducting layer.

5. Apparatus according to claim 4 in which the electrically conducting layer of the memory element is essentially polycrystalline semiconductor which contains electrically significant impurities sufficient to render the layer electrically conductive.

6. Semiconductor apparatus according to claim 2 in which said refresh terminal means is connected to said electrical means including circuit means for providing an A.C. voltage to said refresh terminal means.

7. Apparatus according to claim 6 in which said circuit means is such that the A.C. voltage is interruptable to a predetermined voltage level during operation in response to an enable signal applied to said circuit means.

8. Apparatus according to claim 6 in which the said different terminal of the memory element is for connection to a D.C. voltage source.

9. Semiconductor apparatus according to claim 3 in which said different terminal of the memory element is connected to circuit means for providing an A.C. voltage to the said different terminal.

10. Apparatus according to claim 9 in which said circuit means is such that said A.C. voltage is interruptable during operation to a predetermined voltage level in response to an enable signal applied to said circuit means.

11. Apparatus according to claim 9 in which the said electrical means comprises a D.C. source means.

12. Apparatus according to claim 2 in which said memory element together with said first and second transistors are integrated in a single semiconductor substrate and which further includes circuit means for the application of an A.C. voltage to said substrate sufficient to pump the spurious charges into the sink.

13. Apparatus according to claim 12 in which said circuit means is such that said A.C. voltage is interruptable to a predetermined voltage level in response to an enable signal applied to the circuit means.

14. Apparatus according to claim 12 in which said different terminal of the memory element is for connection to a D.C. source means and said electrical means comprises a D.C. source means.

15. A semiconductor device which comprises:
   a. a capacitor memory element capable of storing electrical charge representative of the memory state of the element;
   b. a gating transistor, one of whose relatively high current carrying terminals is connected to a first terminal of the capacitor element in order to provide read and write signals to the memory state of the memory element in either one of two states;
   c. a first switching transistor one of whose high current terminals is connected to the said first terminal of the capacitor element and the other of whose high current terminals is connected to a separate electrically conductive refresh line which is not part of an electrical network for providing said read and write signals to the capacitor element, said refresh line having a refresh terminal means for application thereto of charge sink means for collecting spurious charges in the memory element during operation;
   d. a second switching transistor one of whose high current terminals is connected to the said first terminal of the capacitor element and the other of whose high current terminals is connected to a low current terminal of the first switching transistor, the low current terminal of the second switching transistor being connected to a second terminal of the capacitor memory element.

16. Semiconductor apparatus which comprises an array of semiconductor devices, each device in accordance with claim 15, each capacitor memory element being a layered structure essentially of metal-insulator-semiconductor, each of said devices being integrated in a single crystal semiconductor substrate, portions of which substrate serving as the semiconductor layer for each capacitor element, the gating transistor and the first and second switching transistors being insulated gate field effect transistors.

17. A semiconductor memory cell which comprises:
   a. an electrical memory storage capacitor containing a portion of a surface region of a semiconductor substrate for charge storage in accordance with electrical signals delivered to said capacitor from an input access network;
   b. first insulated gate field effect transistor means for draining off spurious charge from the said substrate portion to a voltage source which is connected through a refresh line to the drain of said first transistor, the gate to drain capacitance of the first transistor being smaller than the capacitance of the memory capacitor; and
   c. a second insulated gate field effect transistor means for controlling the first transistor, the source terminal of the second transistor being connected both to the source terminal of the first transistor and to the substrate portion of the storage capacitor, the gate electrode of the second transistor being connected to a plate of the storage capacitor spaced apart from the said substrate portion, the drain terminal of the second transistor being connected to the gate elecrode of the first transistor.

18. Apparatus which comprises:
   a. a capacitor memory element capable of storing electrical charge to represent binary digital memory states of the element;
   b. a first electrical network for providing access writing and reading signals to the element;
   c. a second electrical network separate from said first network including a first switching transistor having one of its high current carrying terminals ohmically coupled to a first terminal of the memory element and having another of its high current terminals ohmically coupled to an electrically conductive refresh line for preserving the memory states of the capacitor in the absence of access signals, by collecting spurious charges from said capacitor which are being generated therein during operation.

19. Apparatus according to claim 18, which further includes a second switching transistor having one of its high current carrying terminals ohmically coupled to the first terminal of the memory element and another of its high current carrying terminals ohmically coupled to a low current carrying terminal of the first switching transistor, a low current carrying terminal of the second switching transistor being ohmically coupled to a second terminal of the memory element insulated from the first terminal thereof.

20. Apparatus according to claim 19 in which the capacitor memory element formed by a layered structure of metal-like, insulator, and semiconductor layers, respectively, which is integrated in a monocrystalline semiconductor substrate, the second switching transistor being an insulated gate field effect transistor having source, gate, and drain regions in said substrate, the said source region of the second switching transistor being provided by a portion of the semiconductor substrate underlying the metal-like layer of the capacitor memory element and bordering on the gate region of the said second switching transistor.

21. Apparatus according to claim 20, in which the semiconductor is silicon.

22. Apparatus in accordance with claim 21, in which the said refresh line is connected to circuit means for providing an A.C. voltage of predetermined excursion to said refresh line sufficient to collect said spurious charges during operation.

23. Apparatus in accordance with claim 22, in which said A.C. voltage is interruptable to a predetermined voltage level in response to an enable signal applied to said circuit means.

24. Apparatus according to claim 23, in which said substrate has a terminal for the application thereto of a reverse bias voltage for forming a depletion layer in the semiconductor surface portion underneath the metal-like layer during operation and in which said second terminal of the memory element is for connection to a D.C. voltage source.

25. Apparatus according to claim 21, in which the first terminal of the memory element is connected to circuit means for providing an A.C. voltage to said second terminal of the memory element sufficient to pump said spurious charges into the refresh line during operation.

26. Apparatus according to claim 25, in which said refresh line has a terminal for connection to a D.C. voltage source.

27. Apparatus according to claim 26, in which said A.C. voltage is interruptable to a predetermined voltage level in response to an enable signal applied to said circuit means.

28. Apparatus according to claim 27, in which said substrate has a terminal for the application thereto of a reverse bias voltage for forming a depletion layer in the semiconductor surface portion underneath the metal-like layer during operation.

29. Apparatus according to claim 21, in which said substrate has a terminal for application thereto of an A.C. voltage with an average voltage level sufficient to form a depletion layer in the semiconductor surface portion underneath the metal-like layer during operation and in which said refresh line has a terminal for connection to a D.C. voltage source.

30. Apparatus according to claim 29, which further includes circuit means for applying the A.C. voltage to said terminal of the substrate, said A.C. voltage being interruptable to a predetermined voltage level in response to an enable signal applied to said circuit means.

31. Apparatus according to claim 30, in which the second terminal of the memory element is for connection to a D.C. voltage source.

32. Apparatus which comprises:
   a. a capacitor memory element capable of storing electrical charge to represent binary digital memory states of the element;
   b. a first electrical network means for providing access reading and writing signals to the element; and
   c. a second electrical network refresh means including first and second switching transistors, each having a pair of high current terminals and a low current terminal, one high current terminal of the first switching transistor being connected to a terminal of the memory element and the other high current terminal of the first switching transistor being connected to an electrical refresh line which is not a part of the first network, one high current terminal of the second switching transistor being connected to the one high current terminal of the first switching transistor and the other high current terminal of the second switching transistor being connected to the low current terminal of the first switching transistor, the low current terminal of the second switching transistor being connected to a different terminal of the memory element.

33. The apparatus of claim 32, in which the first and second switching transistors are insulated gate field effect transistors and in which the one and the other high current terminals are source and drain regions in the transistors, and in which the low current terminals are gate electrodes of the transistors; the gate to drain electrical capacitance of the first switching transistor being less than the capacitance of the memory element.

34. Apparatus according to claim 33, in which the capacitor is integrated in a semiconductor substrate and in which the switching transistors and the capacitor are all integrated in a monocrystalline semiconductor substrate.

35. Apparatus according to claim 34, in which the memory element is a layered structure of an electrically insulating layer sandwiched between a semiconductor layer and an electrically conducting layer.

36. Apparatus according to claim 35, in which the electrically conducting layer is essentially polycrystalline semiconductor which contains electrically significant impurities sufficient to render the layer electrically conductive.

37. Apparatus according to claim 33, in which the refresh line is connected to an A.C. source means for acting as a sink for spurious charges in the memory element.

38. A semiconductor device which comprises:
a. a capacitor memory element capable of storing electrical charge representative of the memory state of the element;
b. a gating transistor, one of whose relatively high current carrying terminals is connected to a first terminal of the capacitor element in order to control the memory state of the memory element in one of two states;
c. a first switching transistor one of whose high current terminals connected to the said first terminal of the capacitor element and the other of whose high current terminals connected to an electrical refresh line which is not part of an electrical access network for reading and writing access to the capacitor element;
d. a second switching transistor one of whose high current terminals is connected to the said first terminal of the capacitor element and the other of whose high current terminals is connected to a low current terminal of the first switching transistor, the low current terminal of the second switching transistor being connected to a second terminal of the capacitor memory element.

39. Semiconductor apparatus which comprises an array of semiconductor devices, each device comprising an MIS layered semiconductor capacitor memory element, a gating transistor, a first switching transistor, and a second switching transistor mutually connected in accordance with claim 39, said device being integrated in a single crystal semiconductor substrate portions of which serving as the semiconductor layer for each capacitor element, the gating transistor and the first and second switching transistors being insulated gate field effect transistors.

40. Apparatus which comprises:
a. a capacitor memory element capable of storing electrical charge to represent binary digital memory states of the element;
b. a first electrical network for providing access writing and reading signals to the element;
c. a second electrical network including a switching transistor having one of its high current carrying terminals D.C. coupled to a first terminal of the memory element and having another of its high current terminals D.C. coupled to a refresh line for preserving the memory states of the capacitor in the absence of access signals, said line having a terminal means for the application of an A.C. voltage source thereto.

41. Apparatus according to claim 40, which further includes a second switching transistor having one of its high current carrying terminals D.C. coupled to the first terminal of the memory element and another of its high current carrying terminals D.C. coupled to a low current carrying terminal of the first switching transistor, a low current carrying terminal of the second switching transistor being D.C. coupled to a second terminal of the memory element insulated from the first terminal thereof.

42. Apparatus according to claim 41, in which the capacitor memory element formed by a layered structure of metal-like, insulator, and semiconductor layers which is integrated in a monocrystalline semiconductor substrate, the second switching transistor being an insulated gate field effect transistor having source, gate, and drain regions in said substrate the said source region of the second switching transistor being provided by a portion of the semiconductor substrate underlying the metal-like layer of the capacitor memory element and bordering on the gate region of the said second switching transistor.

43. Apparatus according to claim 42, in which the semiconductor is silicon.

* * * * *

UNITED STATES PATENT AND TRADEMARK OFFICE
CERTIFICATE OF CORRECTION

PATENT NO. : 4,030,083
DATED : June 14, 1977
INVENTOR(S) : Harry J. Boll

It is certified that error appears in the above-identified patent and that said Letters Patent are hereby corrected as shown below:

Column 4, line 41, "C2" should be --$C_2$--; line 45, "$C_2$ (of $T_2$)" should be --($C_2$ of $T_2$)--. Column 7, line 5, "lines" should be --line--. Column 10, line 10, "A.c." should be --A.C.--; line 49, delete "its" at end of line; line 50, delete "thick )." at beginning of line. Column 10, line 58, "thich" should be --thick--. Column 14, line 25, "2/1" should be --z/1--.

Signed and Sealed this

Eighth Day of November 1977

[SEAL]

Attest:

RUTH C. MASON
*Attesting Officer*

LUTRELLE F. PARKER
*Acting Commissioner of Patents and Trademarks*